United States Patent
Van Kampen et al.

(10) Patent No.: US 9,385,594 B2
(45) Date of Patent: Jul. 5, 2016

(54) TWO-STATE CHARGE-PUMP CONTROL-LOOP FOR MEMS DVC CONTROL

(71) Applicant: CAVENDISH KINETICS, INC., San Jose, CA (US)

(72) Inventors: Robertus Petrus Van Kampen, S-Hertogenbosch (NL); Cong Quoc Khieu, San Jose, CA (US); James Douglas Huffman, Plano, TX (US); Richard L. Knipe, McKinney, TX (US)

(73) Assignee: Cavendish Kinetics, Inc., San Jose, CA (US)

( * ) Notice: Subject to any disclaimer, the term of this patent is extended or adjusted under 35 U.S.C. 154(b) by 0 days.

(21) Appl. No.: 14/783,281

(22) PCT Filed: Apr. 2, 2014

(86) PCT No.: PCT/US2014/032719
§ 371 (c)(1),
(2) Date: Oct. 8, 2015

(87) PCT Pub. No.: WO2014/165621
PCT Pub. Date: Oct. 9, 2014

(65) Prior Publication Data
US 2016/0065058 A1    Mar. 3, 2016

Related U.S. Application Data

(60) Provisional application No. 61/808,374, filed on Apr. 4, 2013.

(51) Int. Cl.
*H02M 3/07* (2006.01)
*B81B 7/00* (2006.01)

(52) U.S. Cl.
CPC . *H02M 3/07* (2013.01); *B81B 7/00* (2013.01); *B81B 7/008* (2013.01); *B81B 2201/014* (2013.01); *B81B 2203/0109* (2013.01)

(58) Field of Classification Search
CPC . B81B 7/008; B81B 2201/0221; H02M 3/07; H02M 3/073
See application file for complete search history.

(56) References Cited

U.S. PATENT DOCUMENTS

| | | | | |
|---|---|---|---|---|
| 6,774,709 | B2 * | 8/2004 | Castaldo | H02M 3/073 327/536 |
| 7,902,907 | B2 * | 3/2011 | Tanzawa | H01L 27/0802 327/530 |
| 8,446,211 | B2 * | 5/2013 | Lee | H02M 3/07 327/536 |
| 8,604,725 | B2 * | 12/2013 | Ikehashi | H02N 1/006 200/181 |
| 2010/0116632 | A1 | 5/2010 | Smith et al. | |

FOREIGN PATENT DOCUMENTS

DE    10336090 A1    3/2005

* cited by examiner

*Primary Examiner* — Jeffrey Zweizig
(74) *Attorney, Agent, or Firm* — Patterson & Sheridan, LLP

(57) ABSTRACT

The present invention generally relates to a DVC having a charge-pump coupled to a MEMS device. The charge-pump is designed to control the output voltage delivered to the electrodes, such as the pull-in electrode or the pull-off electrode, that move the switching element within the MEMS device between locations spaced far from and disposed closely to the RF electrode.

20 Claims, 23 Drawing Sheets

US 9,385,594 B2

TWO-STATE CHARGE-PUMP CONTROL-LOOP FOR MEMS DVC CONTROL

BACKGROUND OF THE INVENTION

1. Field of the Invention

Embodiments of the present invention generally relate to a charge-pump for use in a micro electromechanical system (MEMS) device.

2. Description of the Related Art

A digital variable capacitor (DVC) operates with electrostatic forces. In this mechanism a force is acting on the moveable MEMS element when a voltage V is applied between the MEMS element and a control electrode. This electrostatic force scales with $(V/gap)^2$. The mechanical counter-balance force comes from a spring suspension system and typically scales linearly with the displacement. The result is that with an increasing voltage V the MEMS device moves a certain distance δ toward the control-electrode. This movement reduces the gap which in turn increases the electrostatic force further. For small voltages, an equilibrium position between the initial position and the electrode is found. However, when the voltage exceeds a certain threshold level (the pull-in voltage), the device displacement is such that the electrostatic force rises faster than the mechanical counterbalance force and the device rapidly snaps-in towards the control-electrode until it comes in contact.

Some DVC devices have a control-electrode above (i.e., a pull-up or pull-off or PU-electrode) and below (i.e., a pull-down or pull-in or PD-electrode) the moveable MEMS element, as shown schematically in FIG. 1. In addition there is an RF-electrode below the moveable MEMS element. During operation the MEMS element is either pulled-up or pulled-down in contact to provide a stable minimum or maximum capacitance to the RF-electrode. In this way the capacitance from the moveable element to the RF-electrode (which resides below the moveable element) can be varied from a high capacitance $C_{max}$ when pulled to the bottom, as shown in FIG. 2, to a low capacitance $C_{min}$ when pulled to the top, as shown in FIG. 3.

The voltages applied to the PD-electrode ($V_{bottom}$) and to the top-electrode ($V_{top}$) typically range from 10V to 40V, which is much larger than the system-level supply voltage VDD which typically ranges from 1.8V to 3.3V.

Therefore, there is a need for an on-chip charge-pump which boosts the voltage levels from VDD to HV.

SUMMARY OF THE INVENTION

The present invention generally relates to a DVC having a charge-pump coupled to a MEMS device. The charge-pump is designed to control the output voltage delivered to the electrodes, such as the pull-in electrode or the pull-off electrode, that move the switching element within the MEMS device between locations spaced far from and disposed closely to the RF electrode.

In one embodiment, a digital variable capacitor comprises: a MEMS device having a first electrode, a second electrode, and a third electrode movable between the first electrode and the second electrode; a waveform controller coupled to the first electrode and the second electrode; and a charge pump coupled to the waveform controller. The charge pump comprises a first capacitor; a second capacitor coupled to the first capacitor at a first capacitor node; a first resistor; a second resistor coupled to the first resistor at a first resistor node, wherein the first resistor node is coupled to the first capacitor node; and a comparator, wherein the first capacitor node is coupled to the comparator.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a DVC having a charge-pump coupled to a MEMS device. The charge-pump is designed to control the output voltage delivered to the electrodes, such as the pull-in electrode or the pull-off electrode, that move the switching element within the MEMS device between locations spaced far from and disposed closely to the RF electrode.

Figure 1:
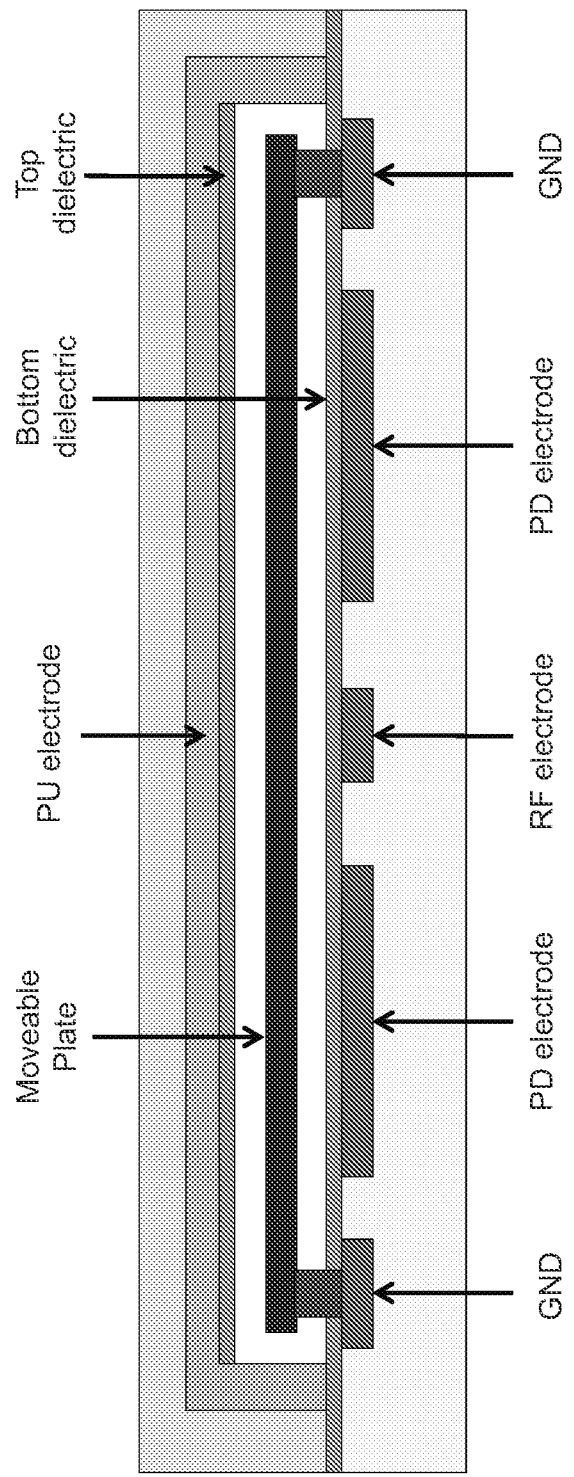
FIG. 1 is a schematic cross-sectional illustration of a MEMS device of a DVC in the free-standing state.
Figure 2:
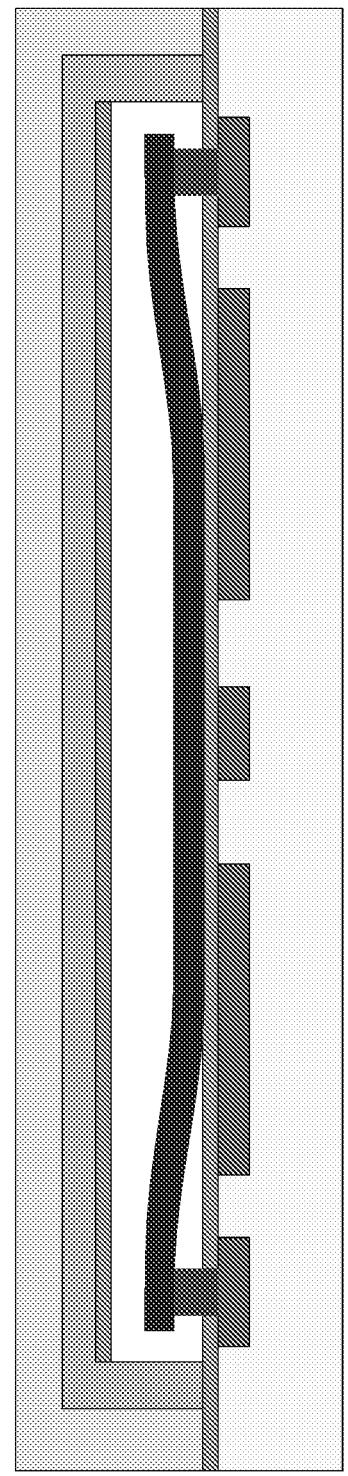
FIG. 2 is a schematic cross-sectional illustration of a MEMS device of a DVC in the $C_{max}$ state.
Figure 3:
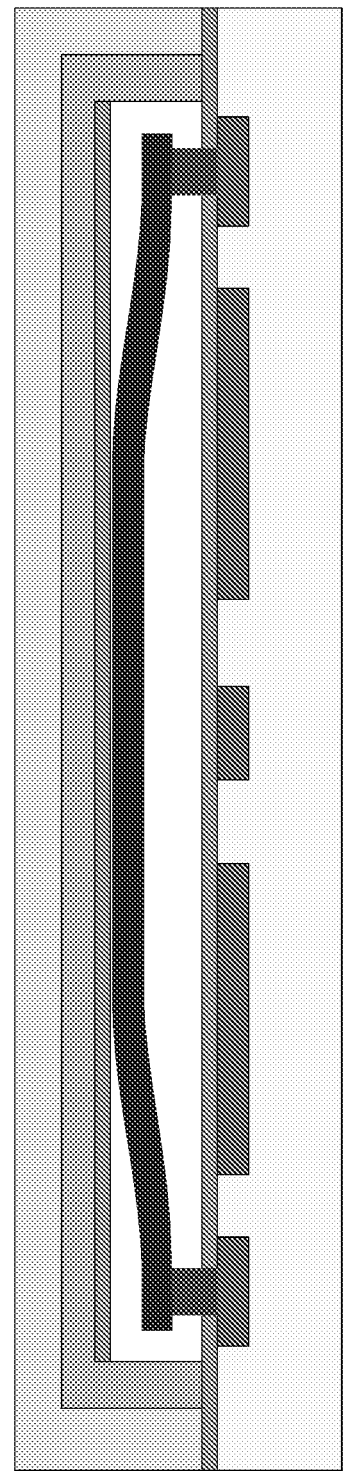
FIG. 3 is a schematic cross-sectional illustration of a MEMS device of a DVC in the $C_{min}$ state.
Figure 4:
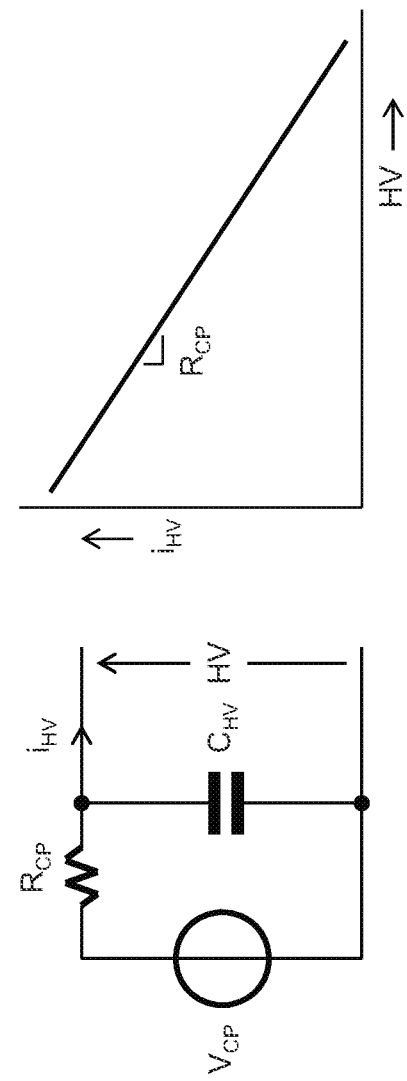
FIG. 4 is a schematic illustration of a basic charge-pump model.

The charge-pump can be modeled as a voltage source with an effective series impedance $R_{CP}$ as shown in FIG. 4. The value of the series impedance depends on the operating frequency of the charge-pump. The higher the operating frequency the lower the effective impedance $R_{CP}$. The output of the charge-pump often has a stabilizing capacitor $C_{HV}$ to reduce the ripple on the output voltage. The output voltage HV of the unregulated charge-pump varies with the load current $i_{HV}$ as shown in FIG. 4.

Figure 5:
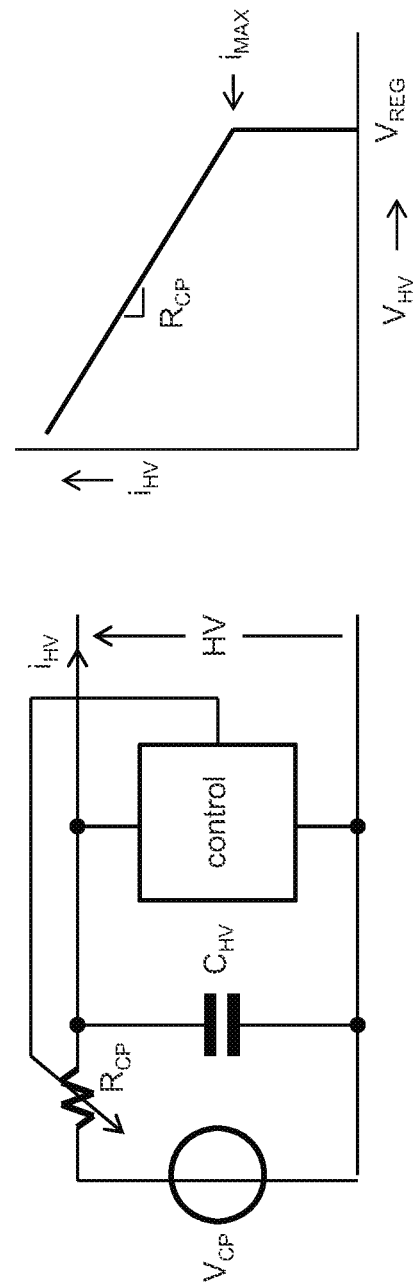
FIG. 5 is a schematic illustration of a basic charge-pump model having a control loop.

To provide for a stable output voltage, the output voltage level is often sensed and used to control the output impedance of the charge-pump, e.g. by adjusting the charge-pump operating frequency, as shown in FIG. 5. When the output voltage is below the desired voltage, the charge-pump is running at a high-frequency and when the voltage is above the desired voltage, the charge-pump is running at a low-frequency (in this state it could operate as low as 0 Hertz, i.e., the charge-pump is not running during this state at all). When the output current draw increases, the charge-pump will run at the high-frequency for a larger percentage of the time to keep the output voltage at the desired output level. As long as the charge-pump can deliver the current, the output voltage can be regulated to the desired voltage level $V_{reg}$ by modulating the period of high-frequency vs. low-frequency. When the output current drawn is larger than the current that the charge-pump can supply ($i_{MAX}$), the charge-pump will continuously run at the high-frequency and the output voltage will drop.

Figure 6:
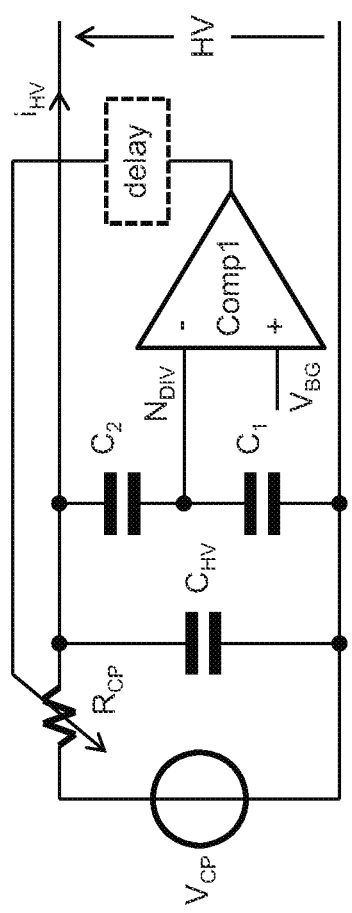
FIG. 6 is a schematic illustration of a two-state charge-pump control scheme having a capacitive divider.
Figure 7:
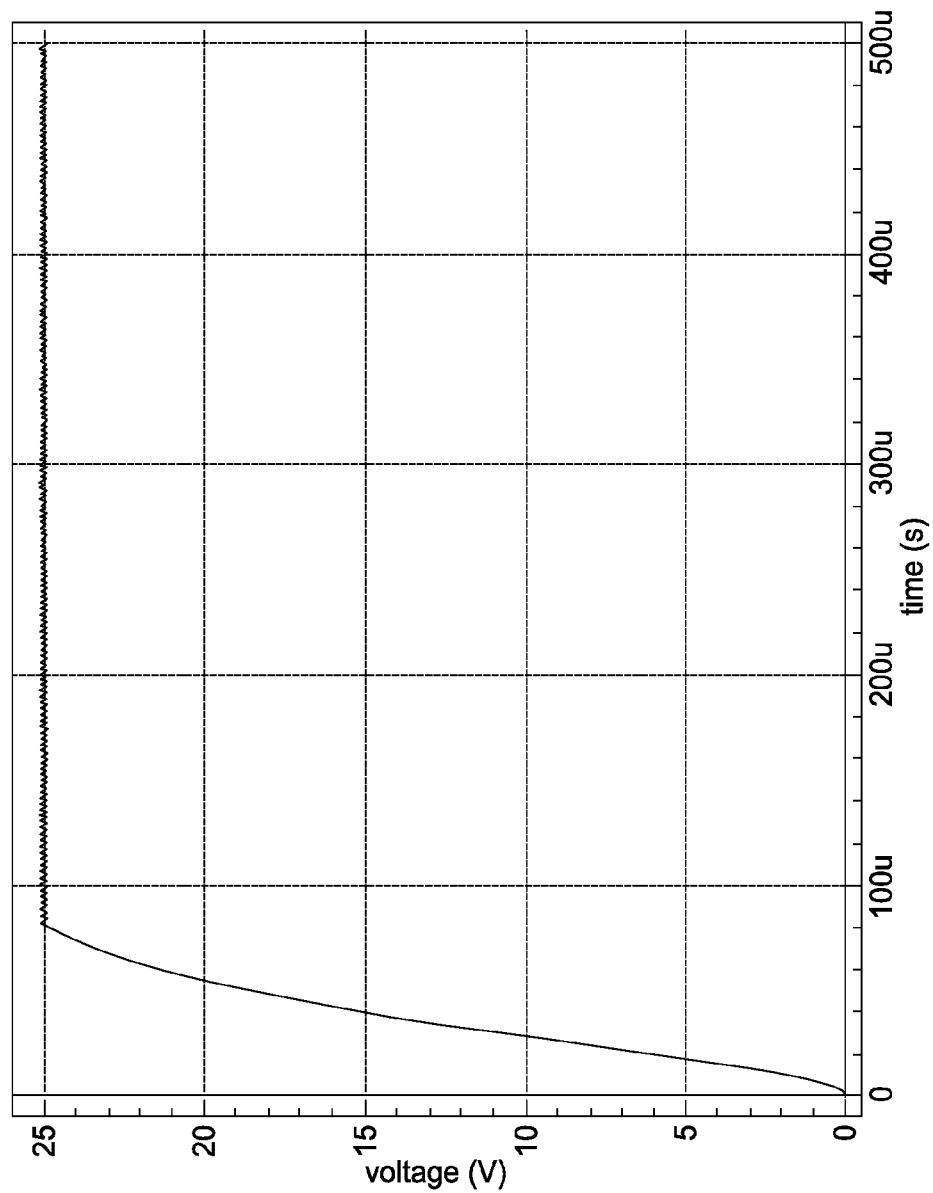
FIG. 7 is a graph illustrating a high-voltage control using the two-state charge-pump of FIG. 6.

FIG. 6 shows an implementation of the control-loop using a two-state control scheme. The capacitive divider C1, C2 is used to generate a voltage on node $N_{DIV}$ equal to C2/(C1+C2)*HV. The voltage is compared against the reference bandgap voltage $V_{BG}$ with comparator Comp1. When the voltage on node $N_{DIV}$ is below $V_{BG}$, the comparator output is high and the charge-pump runs at max frequency. When the voltage on node $N_{DIV}$ is above $V_{BG}$, the comparator output is low and the charge-pump runs at a minimum frequency. Using the control scheme results in an output voltage HV=(1+C1/C2)*$V_{BG}$, as shown in FIG. 7. The frequency at which the charge-pump cycles between the high-frequency mode and low-frequency mode can be controlled by the hysteresis of the comparator and any additional delay added in the feedback loop. Increasing the delay or hysteresis will result in a larger ripple on the output voltage.

Figure 8:
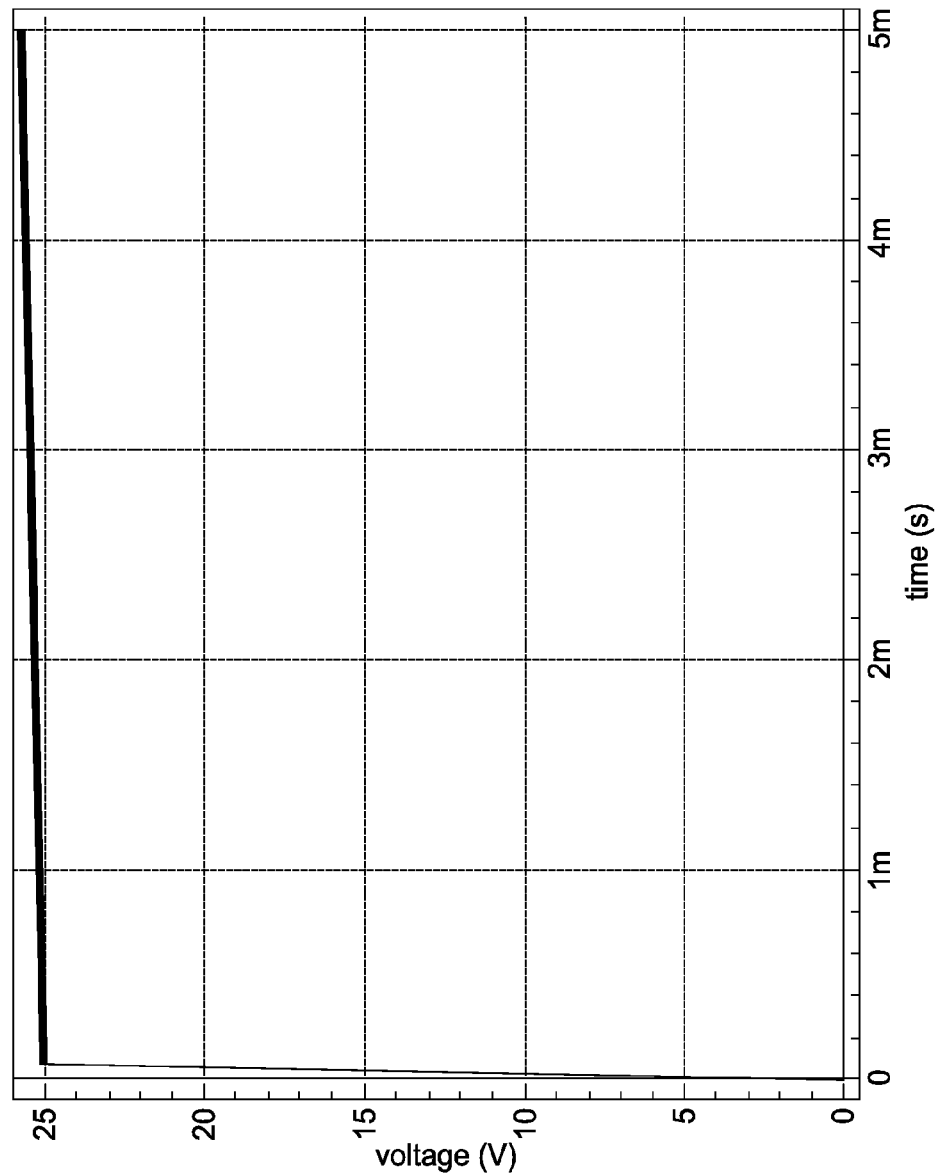
FIG. 8 is a graph illustrating a run-away high-voltage using the two-state charge-pump of FIG. 6.

The downside of the control scheme is that the voltage on the $C_{div}$ node has no DC reference and small leakage currents of the comparator or capacitors can result in a slow drift of the $C_{div}$ node. The result is that the loop will try to compensate for this leakage by increasing or decreasing the charge-pump frequency and the output voltage will slowly run away, as shown in FIG. 8.

Figure 9:
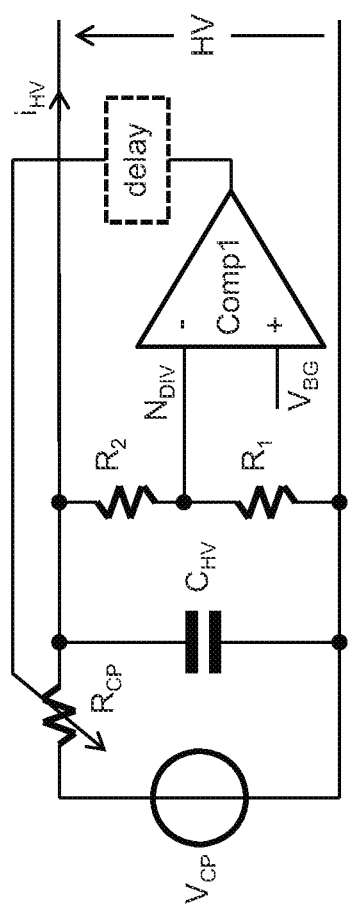
FIG. 9 is a schematic illustration of a two-state charge-pump control scheme using a resistive divider.

An alternative control scheme is shown in FIG. 9 which uses a resistive divider R1, R2 to generate a voltage on node $N_{DIV}$ equal to R1/(R1+R2)*HV. This voltage is again compared to the reference bandgap voltage $V_{BG}$ with comparator Comp1. When the voltage on node $N_{DIV}$ is below $V_{BG}$, the comparator output (Comp) is high and the charge-pump runs at max frequency. When the voltage on node $N_{DIV}$ is above $V_{BG}$, the comparator output is low and the charge-pump runs at a minimum frequency. Using this control scheme results in an output voltage HV=(1+R2/R1)*$V_{BG}$. The frequency at which the charge-pump cycles between the high-frequency mode and low-frequency mode is again controlled by the hysteresis of the comparator and any additional delay added in the feedback loop. Increasing the delay or hysteresis will result in a larger ripple on the output voltage.

The downside of the control-scheme is that the resistive divider draws current out of the charge-pump which reduces the max current $i_{HV}$ that can be delivered to the load. For a MEMS electrostatic application, the current that has to be delivered by the charge-pump to the MEMS element is typically small (e.g., a few micro-amperes). The DC current drawn by the resistive divider can easily get in this range as well. For instance when HV=25V, a resistor value of R1+R2=10 MOhm still draws 2.5 uA. This will require the charge-pump to be designed to be able to deliver more current which will increase the chip-size. To minimize this effect, the resistors of the resistive divider will have to be chosen very large, e.g. ranging from 10 MΩ to 100 MΩ.

Figure 10:
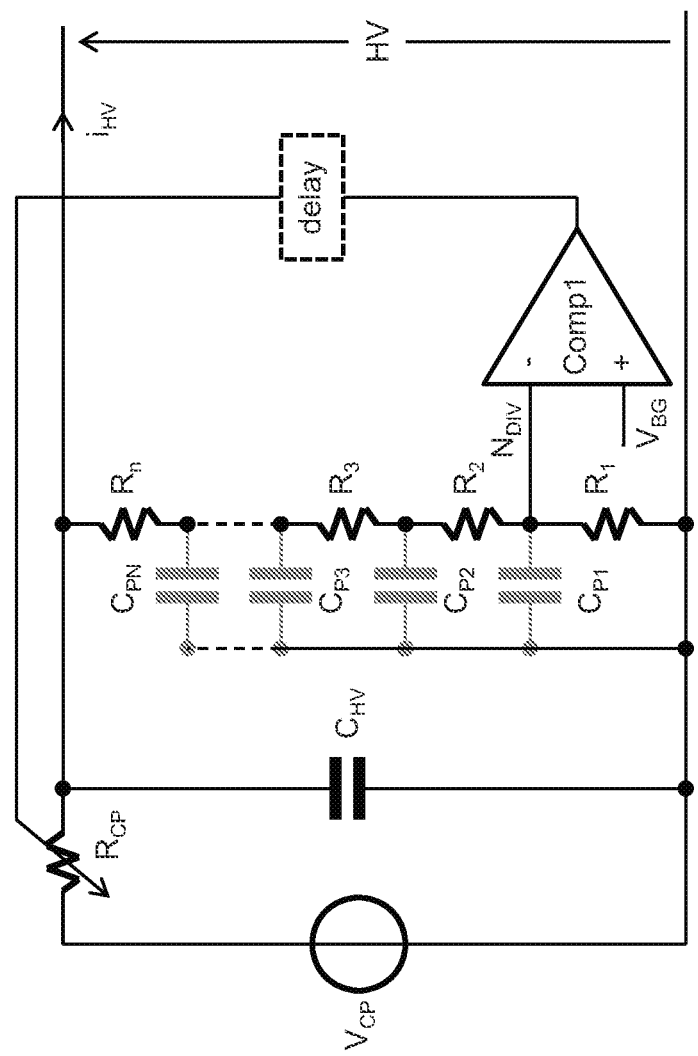
FIG. 10 is a schematic illustration of a charge-pump with a resistive divider showing parasitic capacitances.

Although these resistor values are feasible on-chip using, e.g. high-resistance poly-resistors, resistors in this range typically have parasitic capacitances to the substrate (see Cp1, Cp2, . . . Cpn in FIG. 10) that can result in a very slow response that can take several tens of micro-seconds or longer.

Figure 11:
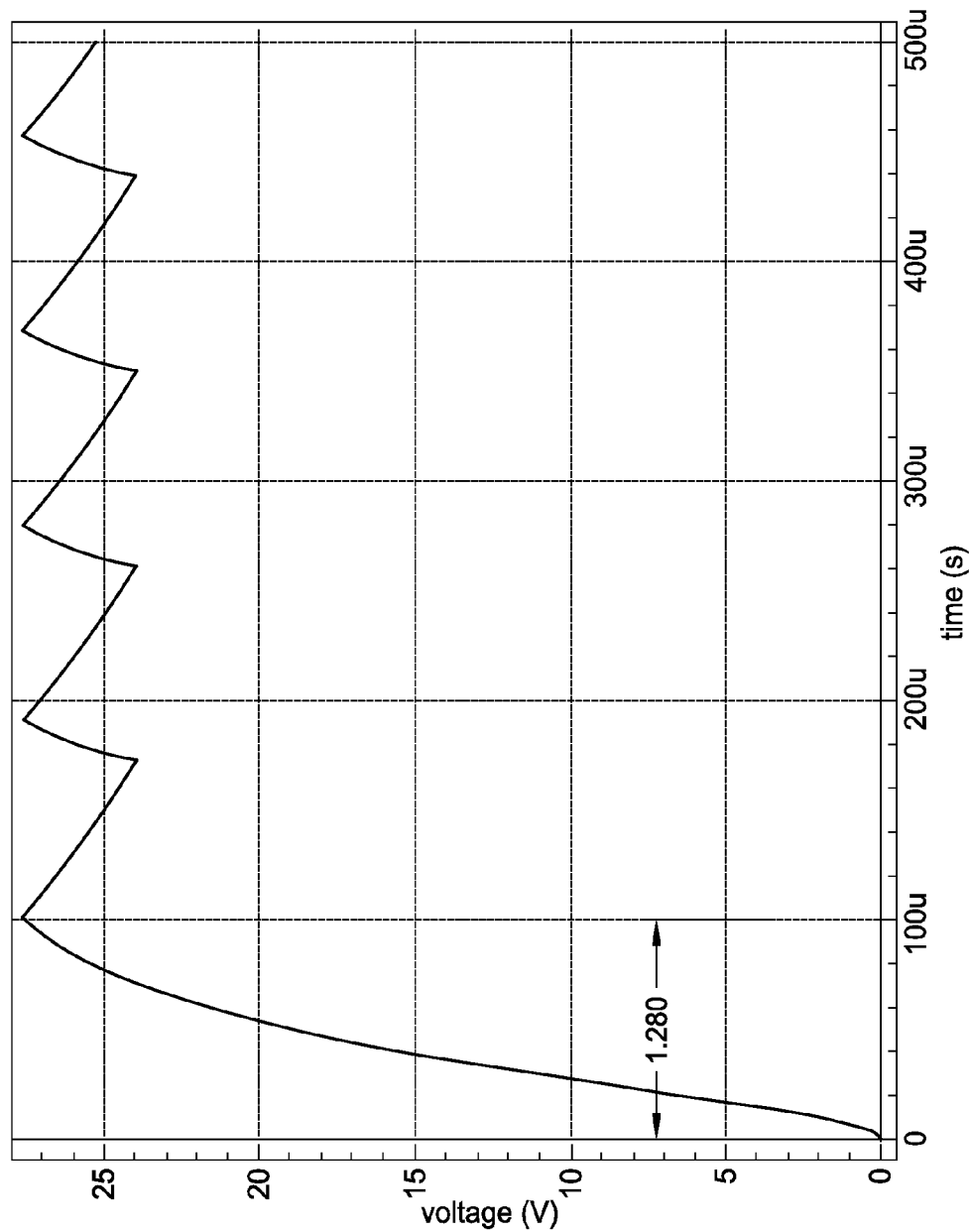
FIG. 11 is a graph illustrating the output of the two-state charge-pump of FIG. 10.

The result is that the voltage on node $N_{DIV}$ tracks the variation in HV slowly and as a result the HV exhibits a large unstable control (see FIG. 11). By the time the $N_{DIV}$ node reacts to the change in the HV level, the HV level itself is already several volts above or below the desired setpoint. The large overshoot during startup and during the operation of the charge-pump will severely impact the performance and lifetime of the MEMS devices.

As discussed herein, a methodology to generate a stable high-voltage to be used for electrostatically actuated MEMS devices is disclosed. The methodology also provides for means to control the MEMS behavior during power-up and power-down of the system.

Figure 12:
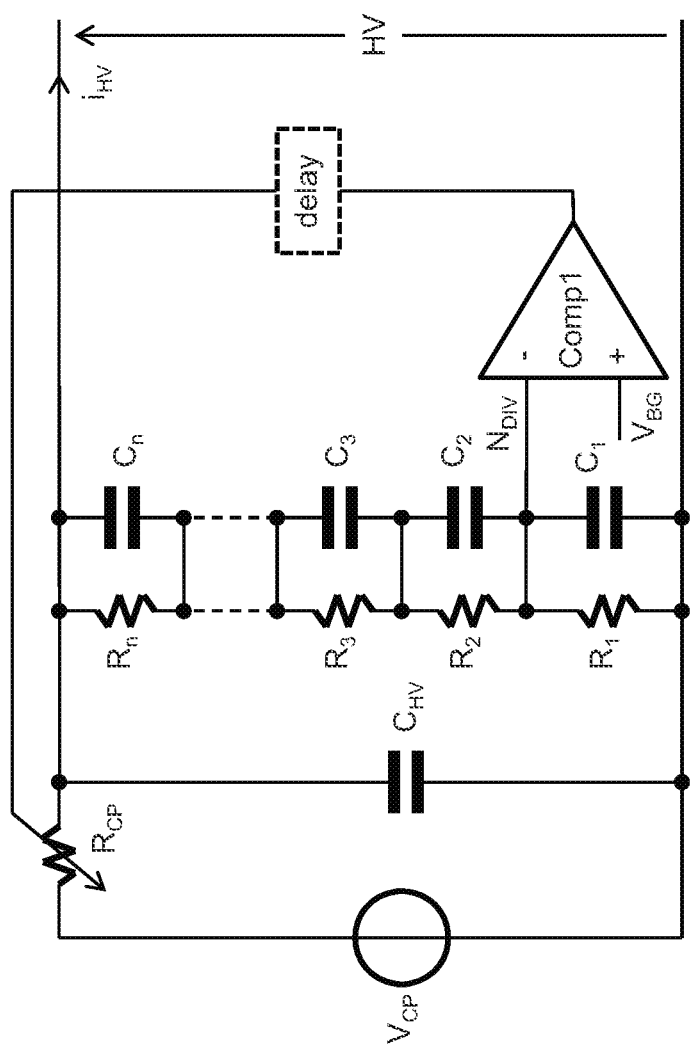
FIG. 12 is a schematic illustration of a charge-pump control-scheme with RC divider according to one embodiment.

A charge-pump that uses a combination of the resistive-divider (R1 . . . Rn) and the capacitive-divider network (C1 . . . Cn) is shown in FIG. 12. Sections of the resistive ladder Ri have been bypassed by capacitors Ci, which allows the voltage on node $N_{DIV}$ to react quickly to changes in HV for a stable loop control. At the same time the resistive ladder provides for the DC bias of all the intermediate capacitive nodes, including $N_{DIV}$. The final control-value is set by the resistive ladder network R1 . . . Rn with HV=(1+(R2+R3+ . . . +Rn)/R1)*$V_{BG}$.

Figure 13:
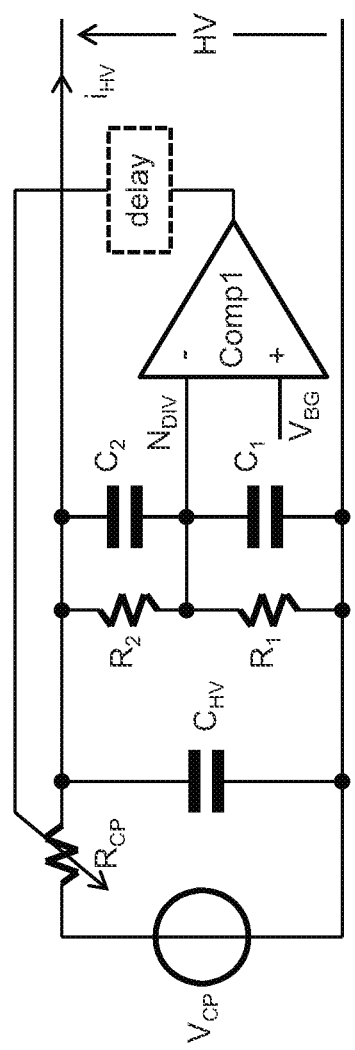
FIG. 13 is a schematic illustration of a charge-pump control-scheme with RC-divider using high-voltage capacitors according to one embodiment.

The resistor portions R2 . . . Rn of the ladder are typically chosen to have approximately the same value so that the voltage drop across each capacitor C2 . . . Cn is approximately the same. This is required because in a typical CMOS process, the capacitors have a limited maximum allowed operating voltage. Applying voltages larger than the max operating voltage can result in capacitor failure. Using the resistor ladder to bias the capacitor nodes ensures a safe operating window for each capacitor. In a process with low-voltage MIM-caps, the max allowed operating voltage of these may be limited to 4V to 8V, requiring up to 7 series capacitors to regulate a 25V output. In a process with high-voltage MIM-caps less series capacitors are required, but at least C1 and C2 should be there (see FIG. 13).

The transient behavior of the control-loop is defined by the capacitive ladder network C1 . . . Cn. The capacitor values have to be chosen sufficiently larger than the parasitic capacitances of the resistive ladder to have a positive effect on the loop, otherwise the loop dynamics on start-up are still dominated by the parasitic capacitances. To minimize the overshoot on start-up, the control-loop has to be slowed down so that the parasitic capacitances of the resistor ladder have time to charge-up and stabilize. This is controlled by the absolute value of the capacitors C1 . . . Cn, but more efficiently by the capacitance ratio C1/(C2+C3+ . . . +Cn). This capacitance ratio needs to be set lower than the resistive ratio (R2+R3+ . . . +Rn)/R1 to ensure that the voltage on node $N_{DIV}$ reaches $V_{BG}$ before the output voltage reaches HV as shown in FIG. 14

If the capacitance ratio is too high then the resistive ladder determines when the voltage on $N_{DIV}$ reaches $V_{BG}$. At this point the charge-pump output has gone much beyond the desired HV level which can cause failures in the MEMS devices. If the capacitance-ratio is set sufficiently lower, the voltage on node $N_{DIV}$ reaches $V_{BG}$ before the output has reached HV. At this point, the comparator Comp1 starts to toggle on and off to keep the voltage on $N_{DIV}$ at $V_{BG}$, while the output voltage continues to rise to HV as the parasitic capacitances are being charged up. Even if the overshoot is large on start-up (e.g., by selecting too high a value for the capacitance ratio) the regulation after stabilization still looks good because the capacitive divider allows the loop to quickly react to HV changes.

Figure 14:
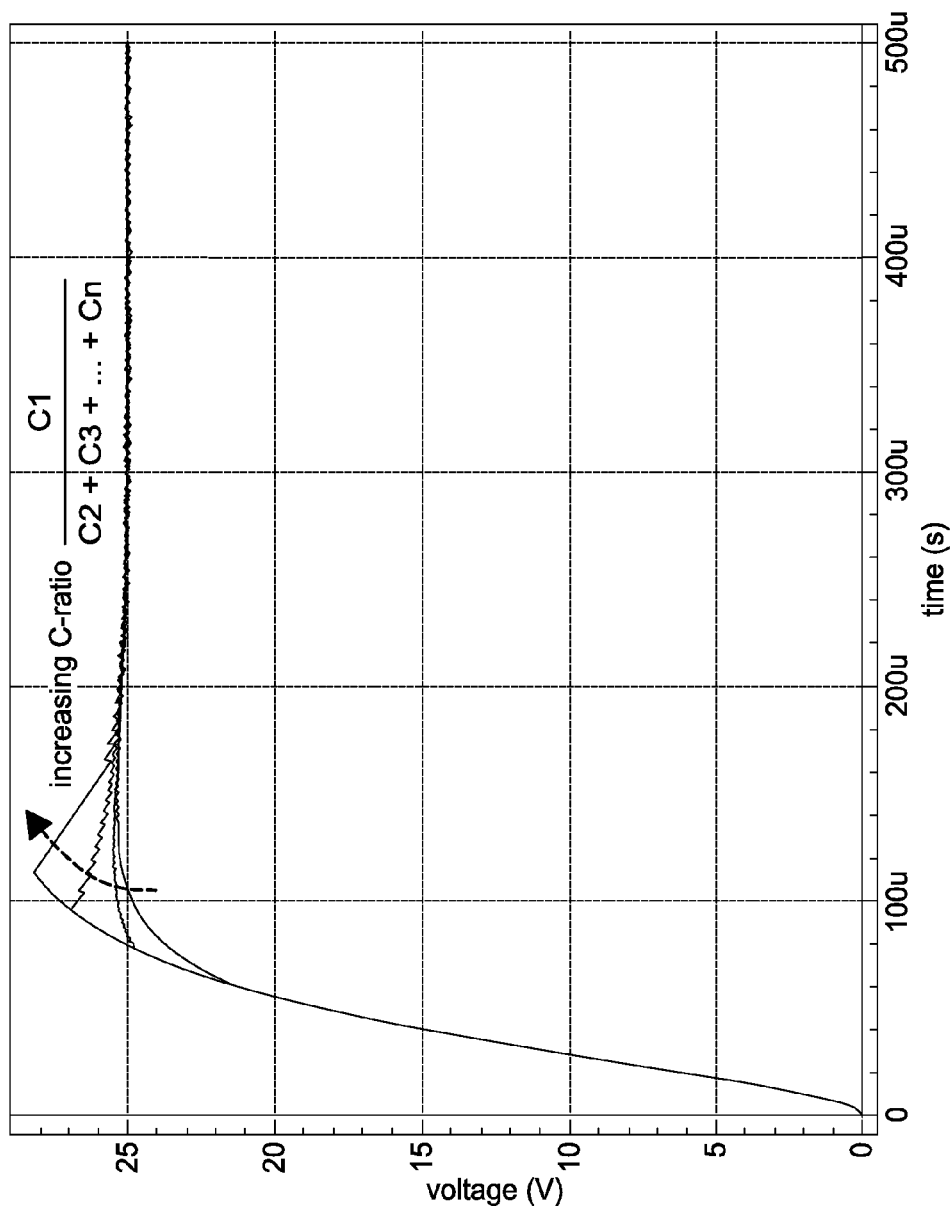
FIG. 14 is a graph illustrating the effect of the capacitance ratio on the start-up behavior of the control-loop.
Figure 15:
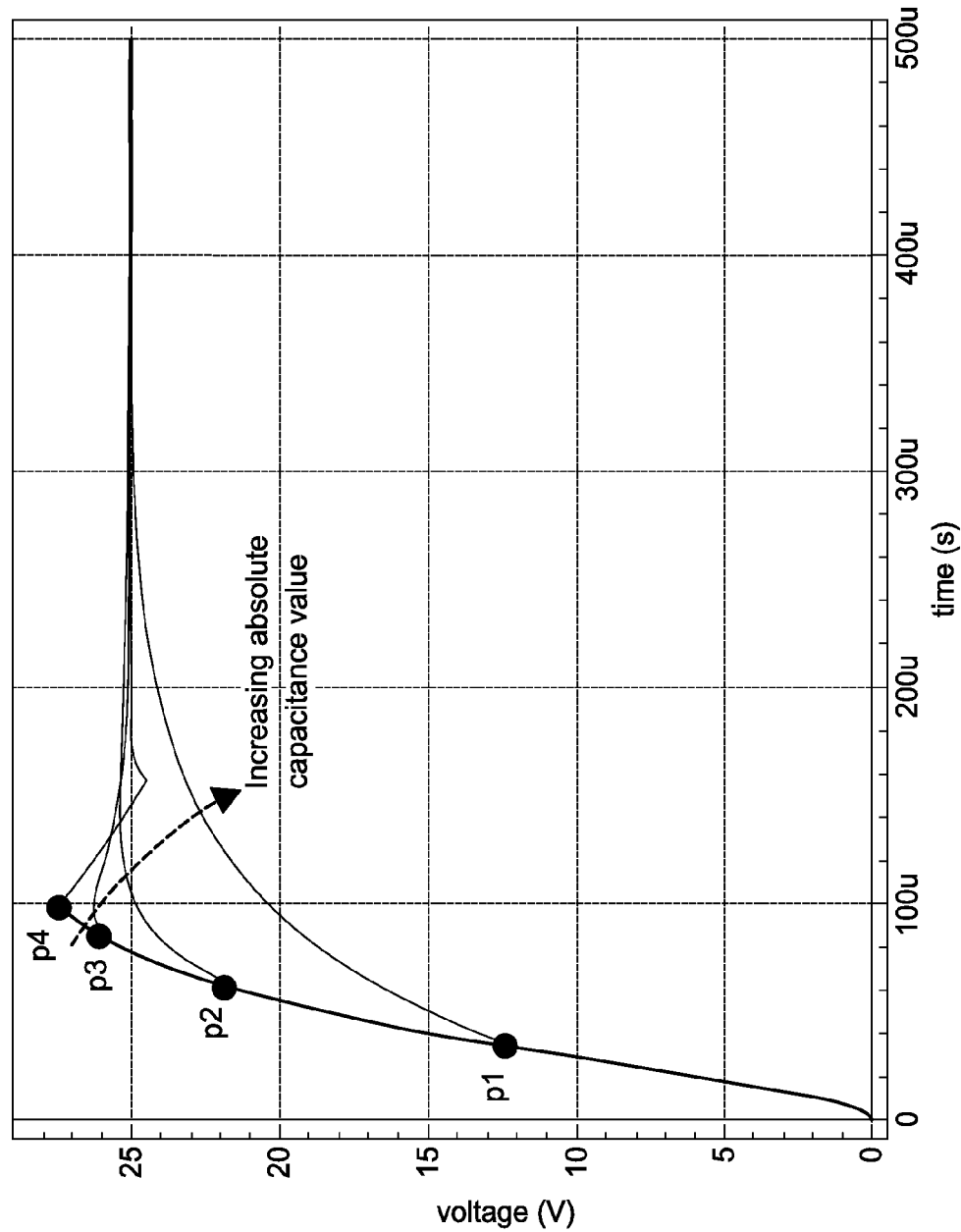
FIG. 15 is a graph illustrating the effect of absolute capacitance value on the start-up behavior of the control-loop.

FIG. 15 shows the effect of the absolute capacitance value on the start-up behavior of the control-loop using the lowest capacitance-ratio setting of FIG. 14. If the absolute capacitance is very small, the start-up behavior is still determined by the parasitic capacitances and mimics the start-up behavior of the resistive control scheme of FIG. 11.

As the absolute capacitance is increased, the parasitics of the resistor ladder are less impacting the overshoot and the loop goes into regulation sooner. This is shown by points p1 . . . p4 which indicates when the comparator Comp1 starts to toggle (p1 for the highest absolute capacitance, p4 for the lowest absolute capacitance).

Figure 16:
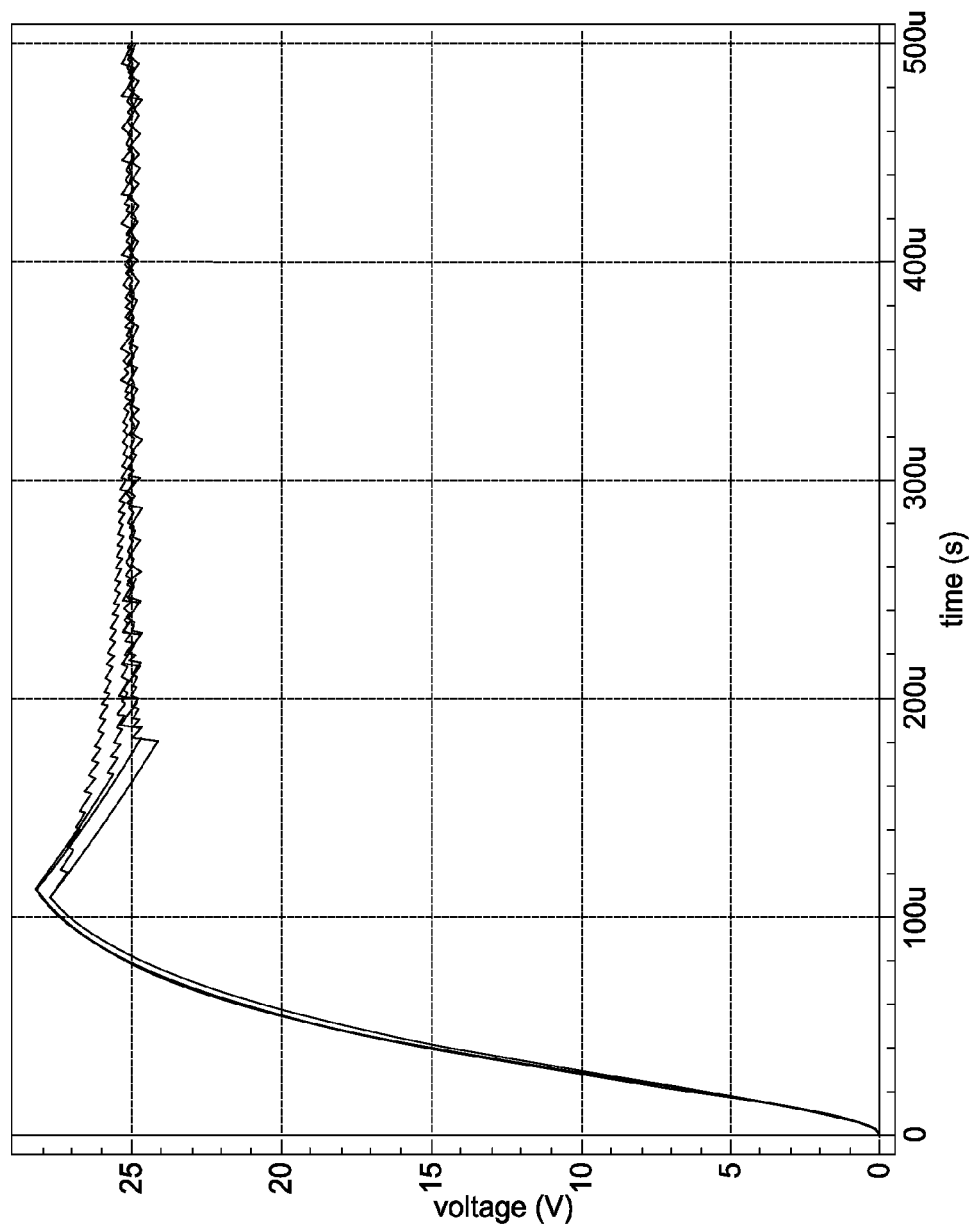
FIG. 16 is a graph illustrating the effect of absolute capacitance on the start-up behavior of the charge-pump when the capacitance ratio is set too high.

If the capacitance-ratio is set too high the overshoot on start-up cannot be eliminated with an increased absolute capacitance value. This is shown in FIG. 16 where the capacitance-ratio was set the same as the resistance-ratio. In this case the voltage on $N_{DIV}$ reaches $V_{BG}$ when the internal parasitic capacitances have charged up already. By that time the output voltage as already passed the HV level by a considerable amount and the overshoot cannot be limited even with large values of the capacitors.

The overshoot on start-up can best be controlled by setting the capacitance ratio between 2 to 10 times smaller than the resistance ratio. This ensures the loop-regulation will start early enough to give the parasitic capacitances in the resistive ladder enough time to charge up to their steady-state value while the output voltage ramps to HV. The absolute capacitance value is then chosen large enough to result in an acceptable variation in start-up behavior with variation in the parasitic capacitances.

The HV voltage level of the charge-pump is not applied to the MEMS DVC directly. In order to ensure a long stable lifetime MEMS operation, the voltage-levels Vtop and Vbottom applied to the MEMS DVC device are shaped using a waveform controller (see FIG. 17). Besides the HV voltage, the charge-pump also needs to supply two additional signals to the waveform controller ($HV_{READY}$ and Reset), which are used during the start-up of the system.

$HV_{READY}$ signals the waveform controller that the charge-pump is ready and the HV is available. It will subsequently cause the waveform controller to initiate a MEMS switch event by applying the right voltage Vtop on the PU-electrodes or Vbottom on the PD-electrodes of the MEMS device. The $HV_{READY}$ signaling keeps the charge-pump load current during the start-up of the charge-pump to a minimum to ensure a robust, fast start-up of the charge-pump. Without this the current drawn out of the charge-pump by the MEMS device on start-up could cause a failure to start-up to the right HV level. The Reset signal is used to reset the voltages applied to the MEMS device by the waveform controller. It ensures that the voltages applied to the MEMS device start from a known free-standing state.

Figure 17:
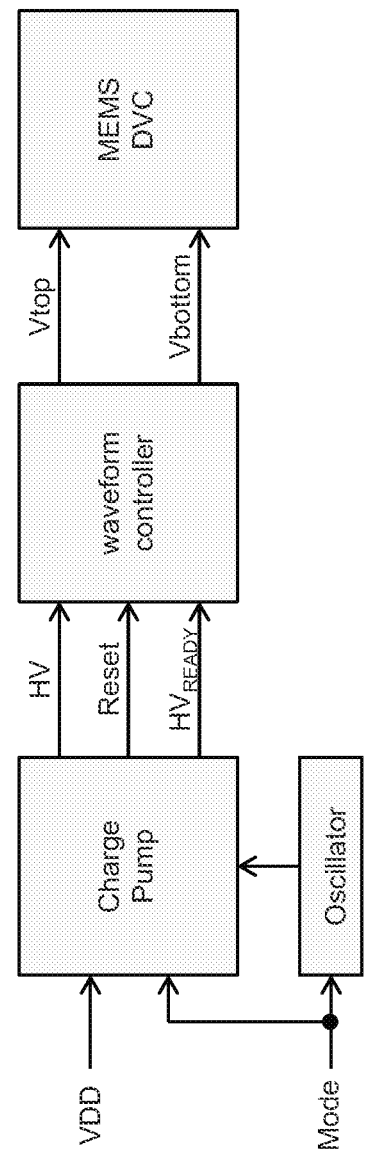
FIG. 17 is a schematic illustration of a system-level view of a DVC control scheme.

One additional provision added to the control system of FIG. 17 is the addition of Mode which is a control-signal that defines whether the charge-pump is running or not. In active-mode the oscillator clock is running and Reset and $HV_{READY}$ are controlled by the charge-pump. In power-down mode, the oscillator clock is stopped and $HV_{READY}$ is reset to 0 and Reset is asserted, which causes the waveform controller to discharge Vtop and Vbottom to 0V. This brings the MEMS devices back to the free-standing state, ready to be programmed in either the up-state or down-state as soon as the system goes back in active mode again.

Figure 18:
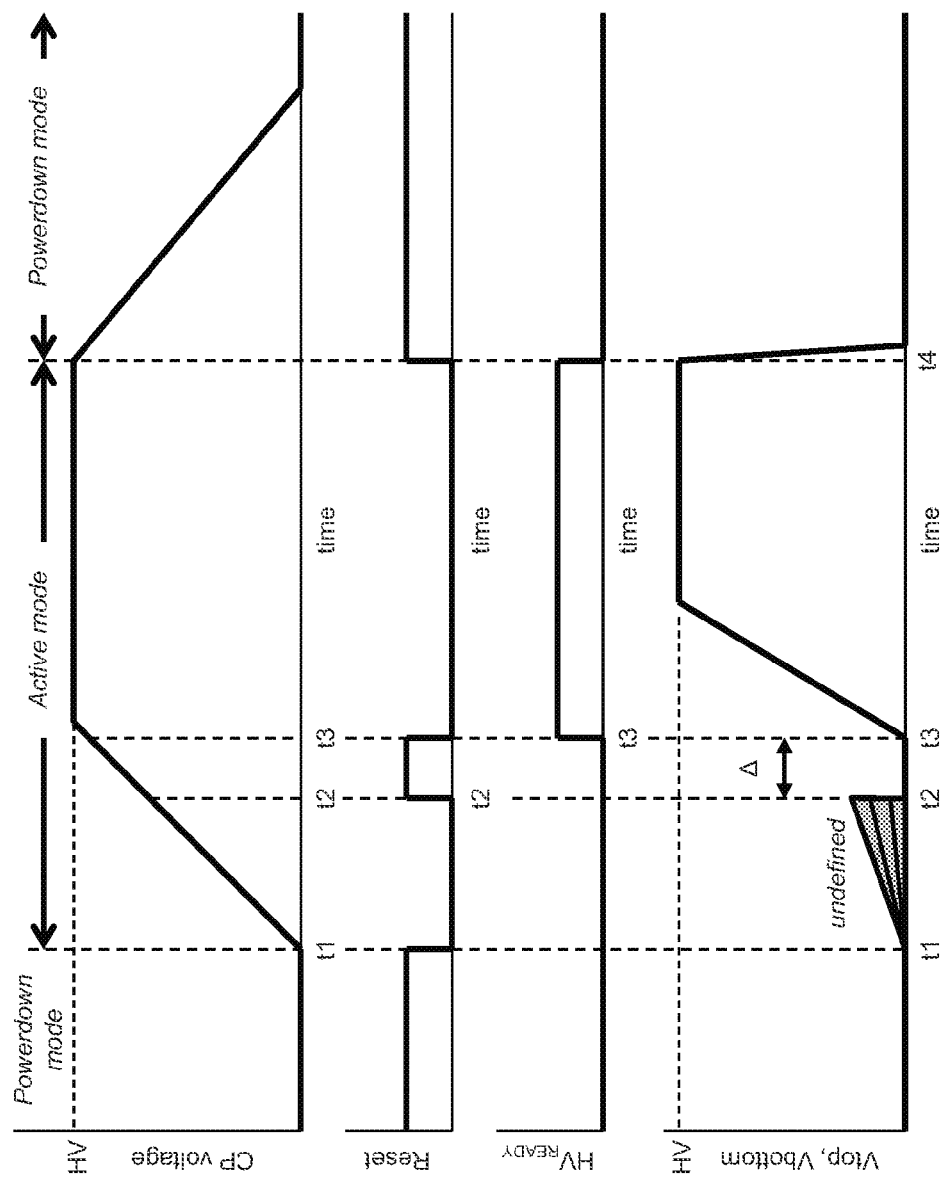
FIG. 18 is a schematic illustration of the output signals of the charge-pump and how the signals are used in the system.

FIG. 18 shows the various signals during start-up and powerdown. Up to time t1 the system is in powerdown mode and the charge-pump is off. The Reset signal is high which keeps the output voltages of the waveform controller at 0V. At t=t1, the system is put in active mode and the Reset signal is turned off, which sets the outputs of the waveform controller in tri-state to minimize the current load on the charge-pump output to guarantee a robust and fast ramp of the output voltage level to HV. Because the outputs of the waveform controller are tri-stated, some small amount of charging of the outputs may occur from capacitive coupling and the control voltages to the MEMS (Vtop, Vbottom) are somewhat undefined.

At t=t2 the HV level is almost reached and the Reset signal is asserted. This resets the outputs of the waveform controller to 0V to ensure that the PU and PD-electrodes of the MEMS device are discharged and the MEMS awaits in the free-standing state waiting to be programmed either up or down.

At t=t3 the charge-pump output has ramped further and is now almost at HV and can deliver enough current to facilitate a MEMS switching event. The $HV_{READY}$ signal is asserted which triggers the waveform controller to ramp the control-voltages to the MEMS DVC device. The time difference $\Delta=t3-t2$ is set large enough to allow for a sufficient discharge of the control-voltages to 0V before the waveform controller starts the voltage ramp on the control-electrodes. A typical value of the discharge time $\Delta$ is 0.5 us to 5 us. This ensures a controlled way of actuating the MEMS device on system start-up to ensure a stable long-life MEMS operation.

At t=t4 the system is put in powerdown mode. This resets the $HV_{READY}$ signal and sets the Reset signal. This triggers the waveform controller to reset the output voltages Vtop, Vbottom to 0V, which brings the MEMS devices back to the free-standing state, ready to be programmed in either the up-state or down-state as soon as the system goes back in active mode again. Although the voltage ramp of Vtop and Vbottom is shown in FIG. 18 as a straight ramp when $HV_{READY}$ is asserted, the actual signal applied to the MEMS is shaped a little different.

Figure 19:
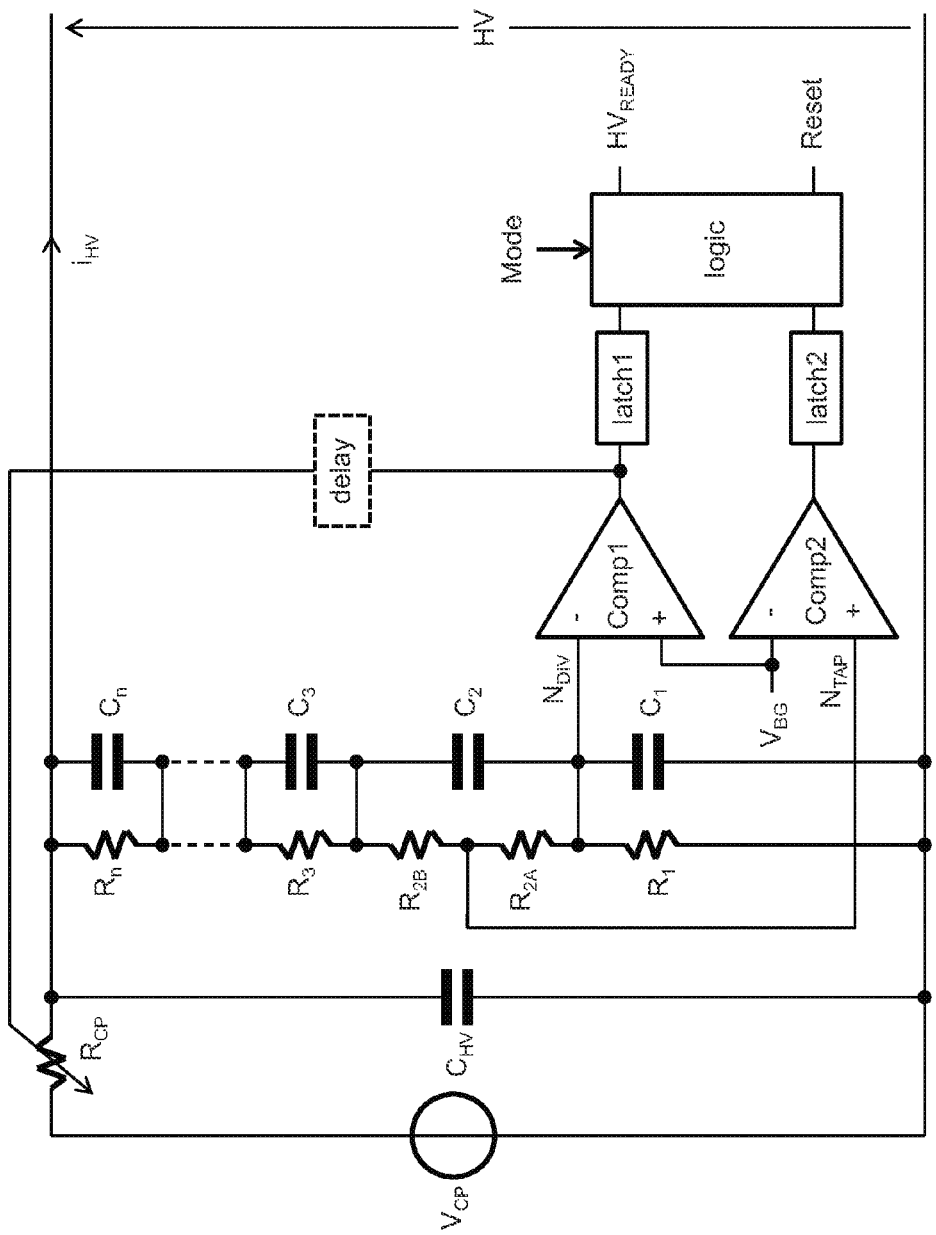
FIG. 19 is a schematic illustration of a charge-pump control-scheme used for a DVC device according to another embodiment.

FIG. 19 shows the final charge-pump control-scheme including the generation of the signals required for the DVC operation. Resistor R2 has been split in two resistors R2a and R2b. This facilitates the addition of an extra sense node $N_{TAP}$, which is fed to the second comparator Comp2. The outputs of Comp1 and Comp2 are latched and fed to some logic circuitry to generate the $HV_{READY}$ and Reset signals as required from FIG. 18.

Figure 20:
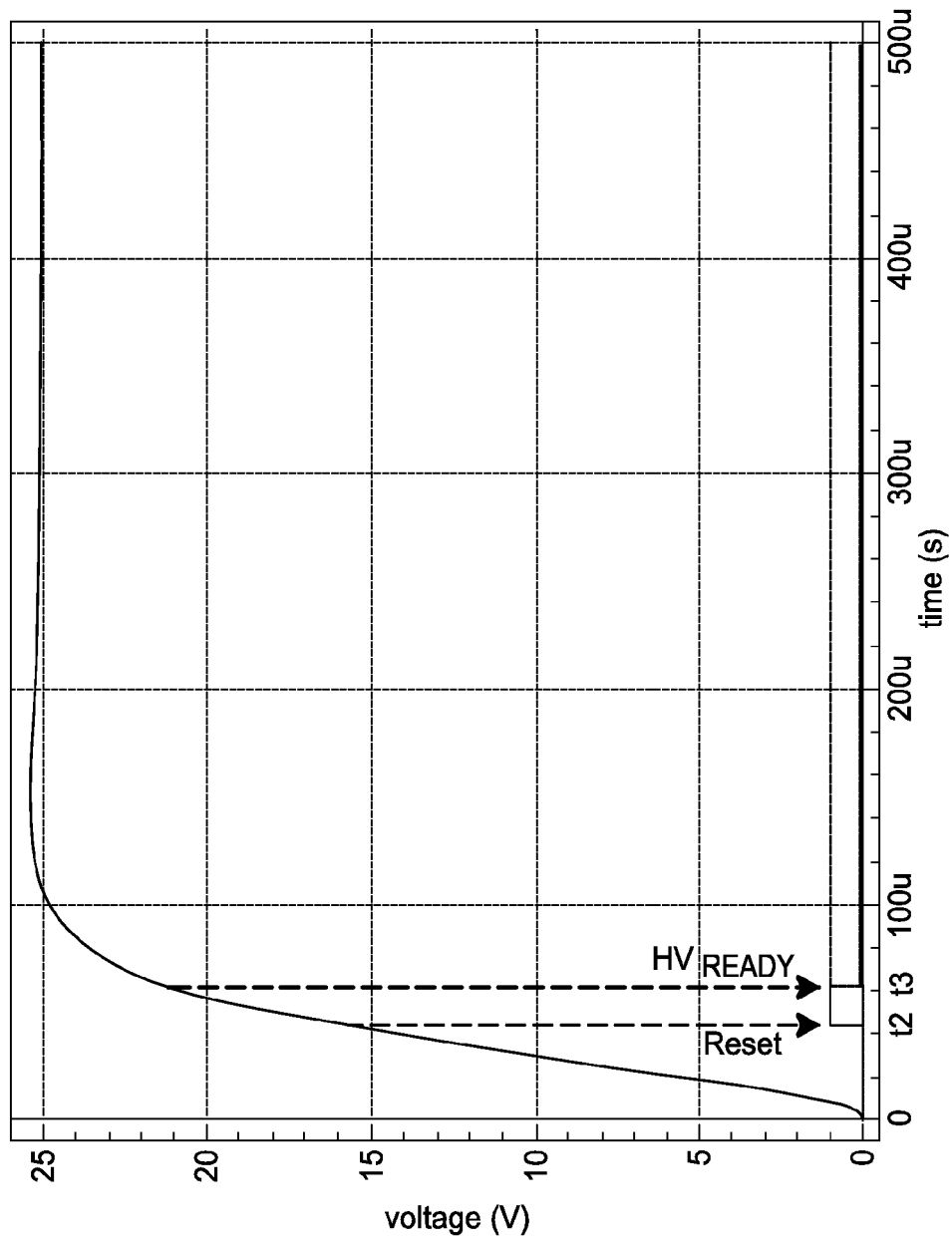
FIG. 20 is a graph illustrating the charge-pump startup of the control-scheme for the charge-pump of FIG. 19.

FIG. 20 shows the start-up response of this control-scheme. During the start-up of the charge-pump the voltage on node $N_{DIV}$ will be below VBG and the output of Comp1 is not toggling yet, causing the charge-pump to operate at the maximum frequency. The voltage on node $N_{TAP}$ will cross VBG first, followed by $N_{DIV}$. As soon as the voltage on $N_{TAP}$ crosses VBG (at t=t2), comparator Comp2 toggles and the output of latch2 is set which causes the Reset signal to be asserted. A little while later (at t=t3), the voltage on $N_{DIV}$ also crosses VBG and the output of Comp1 starts to toggle which triggers latch1. The logic circuitry resets the Reset signal and sets the $HV_{READY}$ signal which will subsequently invoke a MEMS switch event. At this point the output voltage of the charge-pump is not at HV yet because the parasitic capacitances of the resistor ladder are still charging up. The actual voltage level at which $HV_{READY}$ is triggered can be set by a proper selection of the capacitance-ratio. As the MEMS devices are being actuated, the HV continues to ramp to the final HV level. This ensures a reliable operation of the MEMS devices.

Figure 21:
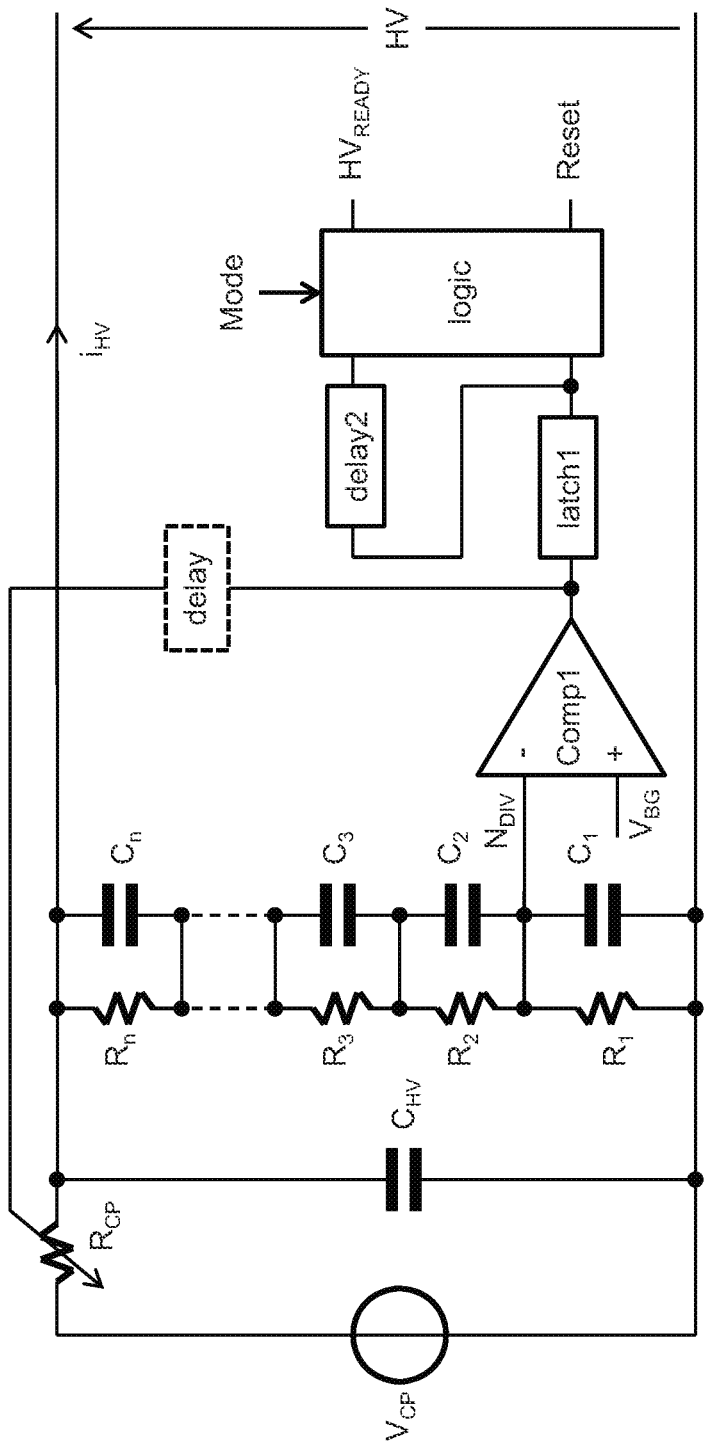
FIG. 21 is a schematic illustration of a charge-pump control-loop according to another embodiment.

FIG. 21 shows an alternative implementation of the charge-pump control-loop. In this case a single comparator is used. To create a delay between the Reset signal and $HV_{READY}$, delay circuit delay2 is used. This delay circuit can either be an analog delay circuit or a clocked delay-line. The delay time between Reset and $HV_{READY}$ is set between 0.5 us and 5 us to allow a sufficient discharge of the control-voltages to 0V before the waveform controller starts the voltage ramp on the control-electrodes. The Reset is derived from the latched Comp1 output and $HV_{READY}$ is derived from the output of delay2. In this way, the MEMS devices are being reset when the loop starts to go into regulation (when Comp1 starts to toggle) and the MEMS actuation starts a little while later as soon as $HV_{READY}$ is set.

Limiting Power Consumption on Power-Up

The maximum operating frequency of the charge-pump is set by the maximum current it needs to provide to the MEMS devices for actuation. The resulting start-up time of the charge-pump can then be faster than required by the system in which it is being used. Although signals Reset and $HV_{READY}$ were added for the MEMS control system, these signals can also be used to limit the power consumption of the charge-pump on start-up.

Figure 22:
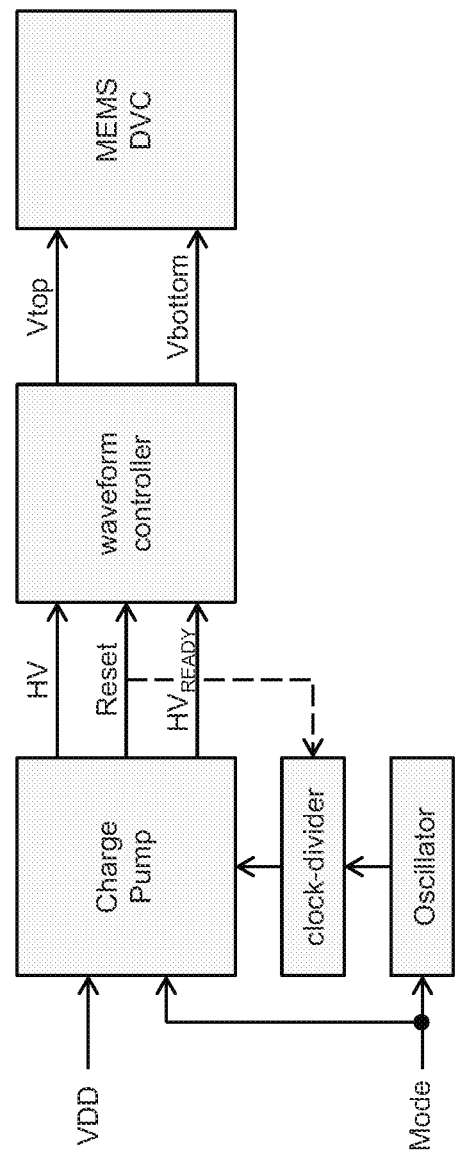
FIG. 22 is a schematic illustration of a control-scheme with clock-divider to limit power on start-up according to one embodiment.

FIG. 22 shows an implementation of this using a clock-divider. The clock-divider is activated by either the Reset or the $HV_{READY}$ signal. On start-up the oscillator frequency is divided so that the charge-pump runs at a reduced frequency. The reduced frequency results in a lower average power consumption on start-up. The division ratio is chosen such to result in an acceptable start-up time and start-up power and is typically a binary value like 2, 4, 8 or 16 for ease of implementation. When the Reset signal (or $HV_{READY}$) is asserted, the clock-divider is turned off so that the full frequency is applied to the charge-pump. This means that when the MEMS switch event is evoked (after $HV_{READY}$ is asserted), the maximum power is available from the charge-pump. Care must be taken in the design that the clock-divide ratio is not set too high. The charge pump still needs to be able to deliver enough current to supply to the resistive ladder R1 ... Rn at HV. If the clock-divide ratio is set too high then the output may not be able to ramp to HV.

Figure 23:
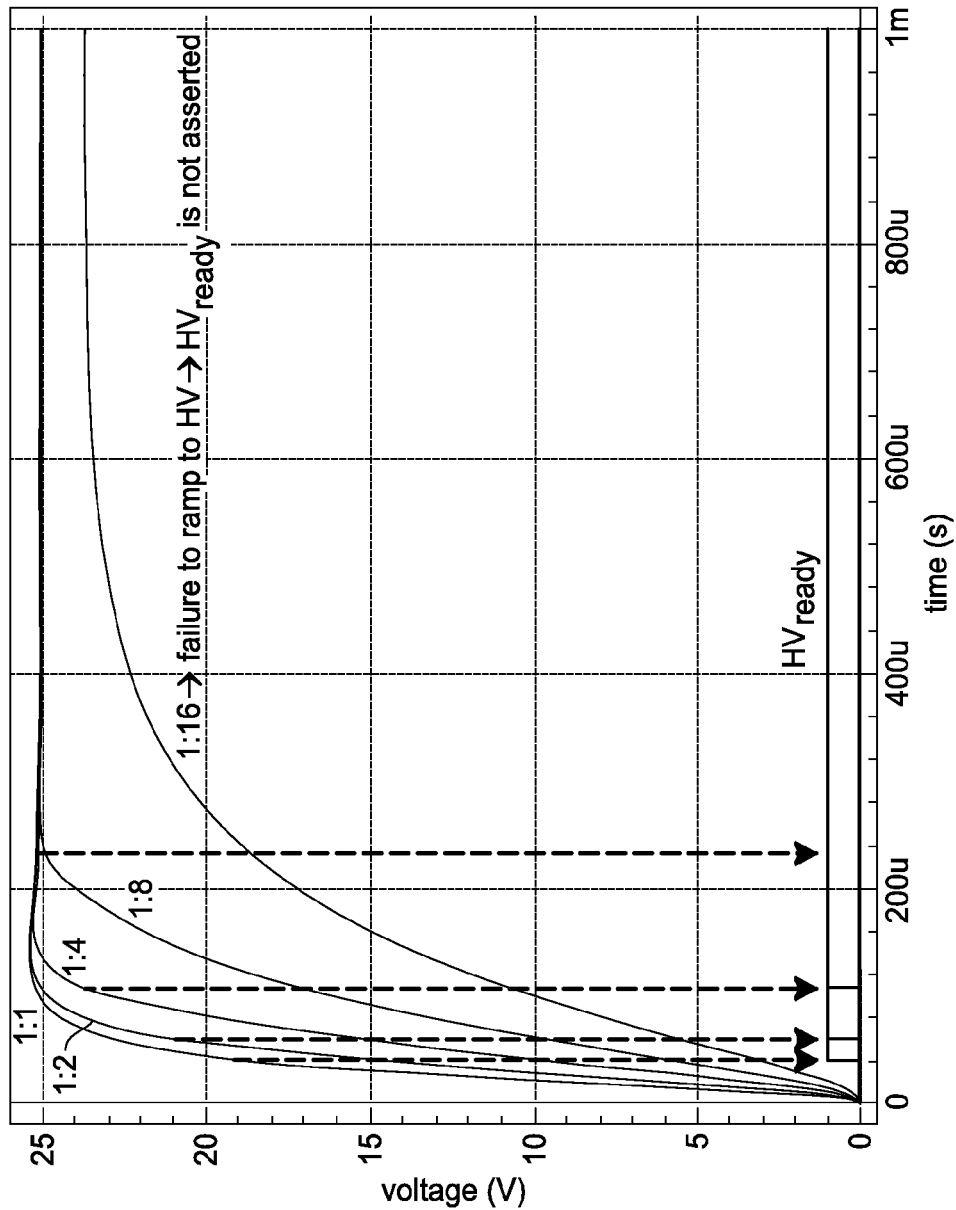
FIG. 23 is a graph illustrating the charge-pump start-up for various clock-divide ratios controlled by $HV_{ready}$.

FIG. 23 shows the start-up behavior of the charge-pump using this control-scheme for various clock-divide ratios. It shows that the slower-clock on start-up results in a longer start-up time. If the clock-divide ratio is set too high (e.g. 1:16 in FIG. 23) then the output voltage cannot ramp to the desired HV level on start-up and $HV_{READY}$ is not asserted. In that case the MEMS switch-event would not be invoked resulting in a system failure. The system-level specs for power-consumption on start-up and the allowed start-up time will determine what clock-divide ratio is acceptable, keeping in mind the above limitation.

While the foregoing is directed to embodiments of the present invention, other and further embodiments of the invention may be devised without departing from the basic scope thereof, and the scope thereof is determined by the claims that follow.

The invention claimed is:

1. A digital variable capacitor, comprising:
   a MEMS device having a first electrode, a second electrode, and a third electrode movable between the first electrode and the second electrode;
   a waveform controller coupled to the first electrode and the second electrode; and
   a charge pump coupled to the waveform controller, the charge pump comprising:
   a first capacitor;
   a second capacitor coupled to the first capacitor at a first capacitor node;
   a first resistor;
   a second resistor coupled to the first resistor at a first resistor node, wherein the first resistor node is coupled to the first capacitor node; and
   a comparator, wherein the first capacitor node is coupled to the comparator.

2. The digital variable capacitor of claim 1, further comprising:
   a third capacitor coupled to the second capacitor at a second capacitor node; and
   a third resistor coupled to the second resistor at a second resistor node.

3. The digital variable capacitor of claim 2, wherein the second resistor node is coupled to the second capacitor node.

4. The digital variable capacitor of claim 3, wherein the second resistor and the third resistor have substantially the same value which is different from the value of the first resistor.

5. The digital variable capacitor of claim 4, wherein the first capacitor, the second capacitor and the third capacitor each have a capacitance that is larger than parasitic capacitances of the first resistor, the second resistor and the third resistor.

6. The digital variable capacitor of claim 5, wherein a capacitance ratio, which is measured by a capacitance of the first capacitor divided by the total capacitance of the remaining capacitors, is less than a resistive ratio, which is measured by the inverse of a resistance of the first resistor divided by the total resistance of the remaining resistors.

7. The digital variable capacitor of claim 6, wherein the capacitance ratio is between about 2 to about 10 times less than the resistive ratio.

8. The digital variable capacitor of claim 1, wherein the comparator is a first comparator, the digital variable capacitor further comprising:
   a third capacitor coupled to the second capacitor at a second capacitor node;
   a third resistor coupled to the second resistor at a second resistor node;

a fourth resistor coupled to the third resistor at a third resistor node.

9. The digital variable capacitor of claim 8, wherein the third resistor node is coupled to the second capacitor node.

10. The digital variable capacitor of claim 9, further comprising a second comparator, wherein the second resistor node is coupled to the second comparator.

11. The digital variable capacitor of claim 10, wherein the sum of the values of the second resistor and the third resistor substantially equals the value of the fourth resistor.

12. The digital variable capacitor of claim 11, wherein the first capacitor, the second capacitor and the third capacitor each have a capacitance that is larger than parasitic capacitances of the first resistor, the second resistor, third resistor and the fourth resistor.

13. The digital variable capacitor of claim 12, wherein a capacitance ratio, which is measured by a capacitance of the first capacitor divided by the total capacitance of the remaining capacitors, is less than a resistive ratio, which is measured by the inverse of a resistance of the first resistor divided by the total resistance of the remaining resistors.

14. The digital variable capacitor of claim 13, wherein the capacitance ratio is between about 2 to about 10 times less than the resistive ratio.

15. The digital variable capacitor of claim 14, further comprising a delay circuit coupled to the first comparator.

16. The digital variable capacitor of claim 1, further comprising:
a first delay circuit coupled to the comparator;
a latch coupled to the comparator; and
a second delay circuit coupled to the latch.

17. The digital variable capacitor of claim 16, wherein the second delay circuit comprises either an analog delay circuit or a clocked delay-line.

18. The digital variable capacitor of claim 17, wherein the charge pump further comprises a stabilizing capacitor.

19. The digital variable capacitor of claim 1, wherein the charge pump further comprises a stabilizing capacitor.

20. The digital variable capacitor of claim 1, further comprising a delay circuit coupled to the comparator.

\* \* \* \* \*